United States Patent [19]
Wang

[11] Patent Number: 6,100,113
[45] Date of Patent: Aug. 8, 2000

[54] VERY THIN MULTI-CHIP-PACKAGE AND METHOD OF MASS PRODUCING THE SAME

[75] Inventor: Peter S. Wang, Basking Ridge, N.J.

[73] Assignee: Institute of Microelectronics, Singapore, Singapore

[21] Appl. No.: 09/114,314

[22] Filed: Jul. 13, 1998

[51] Int. Cl.[7] .......................... H01L 21/44; H01L 21/48; H01L 21/50
[52] U.S. Cl. ........................ 438/107; 438/110; 438/117
[58] Field of Search ................................. 438/107, 106, 438/110, 117

[56] References Cited

U.S. PATENT DOCUMENTS

| | | | |
|---|---|---|---|
| 5,147,210 | 9/1992 | Patterson et al. | 439/91 |
| 5,150,274 | 9/1992 | Okada et al. | 361/382 |
| 5,239,448 | 8/1993 | Perkins et al. | 361/764 |
| 5,578,526 | 11/1996 | Akram et al. . | |
| 5,587,341 | 12/1996 | Masayuki et al. . | |
| 5,602,419 | 2/1997 | Takeda et al. | 257/673 |
| 5,620,928 | 4/1997 | Lee et al. | 438/118 |
| 5,648,679 | 7/1997 | Chillara et al. | 257/666 |
| 5,904,499 | 5/1999 | Pace . | |

OTHER PUBLICATIONS

Chang et al. "ULSI Technology", The McGraw–Hill Companies, 1996 p573–582.
Baggerman et al. "Reliable Au–Su FlipClip Bonding on Flexible Prints", 0569–55031 94/0000–0900 1994IEEE, 1994 p900–905.
Milkovich et al, "Double Sided Flexible Carrier with Discretes and Thermally Enhanced FCA/COF", 0569–5503/93/0000–0016, 1993 IEEE, p16–21.
"Adhesive Based FlipChip Technology for Assembly on Polymide Flex Substrates" 1997, International Conf. on Multichip Modules, p81–86.
Peter–Elenius, "Flex on Cap–Solder Paste Bumping", 1997 International Symposium on Advanced Packaging Materials, p115–116.
R.Aschenbremen "Flip Chip Attachment Using Anisotropic Conductive Adhesives and Electroless Nickel Bumps" 1996 IEEE/CMPT Int'l Electronics Manufacturing Tech Symp. p26–33.
A. Aintila et al, "Electroless Ni/Au Bumps for Flip Chip–on––Flex and TAB Applications", 1994 IEEE/CMPT Int'l Electronics Manufacturing Technology Symposium, p160–164.

*Primary Examiner*—Kevin M. Picardat
*Assistant Examiner*—D. M. Collins
*Attorney, Agent, or Firm*—George O. Saile; Stephen B. Ackerman; Larry J. Prescott

[57] ABSTRACT

A substrate assembly and method of forming the substrate assembly having a very thin form factor and a large amount of manufacturing flexibility. A flexible tape has a number of device blocks. Devices, passive or active, are joined to the device blocks forming a flexible tape assembly and the flexible tape assembly is electrically tested. Substrates are formed having cavities matching the device blocks. The flexible tape assembly is then joined to the substrate such that the devices fit into the cavities, thereby forming a substrate assembly having a very thin form factor. The flexible tape can be stored on a reel and the substrates can be formed in an array and cut to the desired size providing manufacturing flexibility.

13 Claims, 7 Drawing Sheets

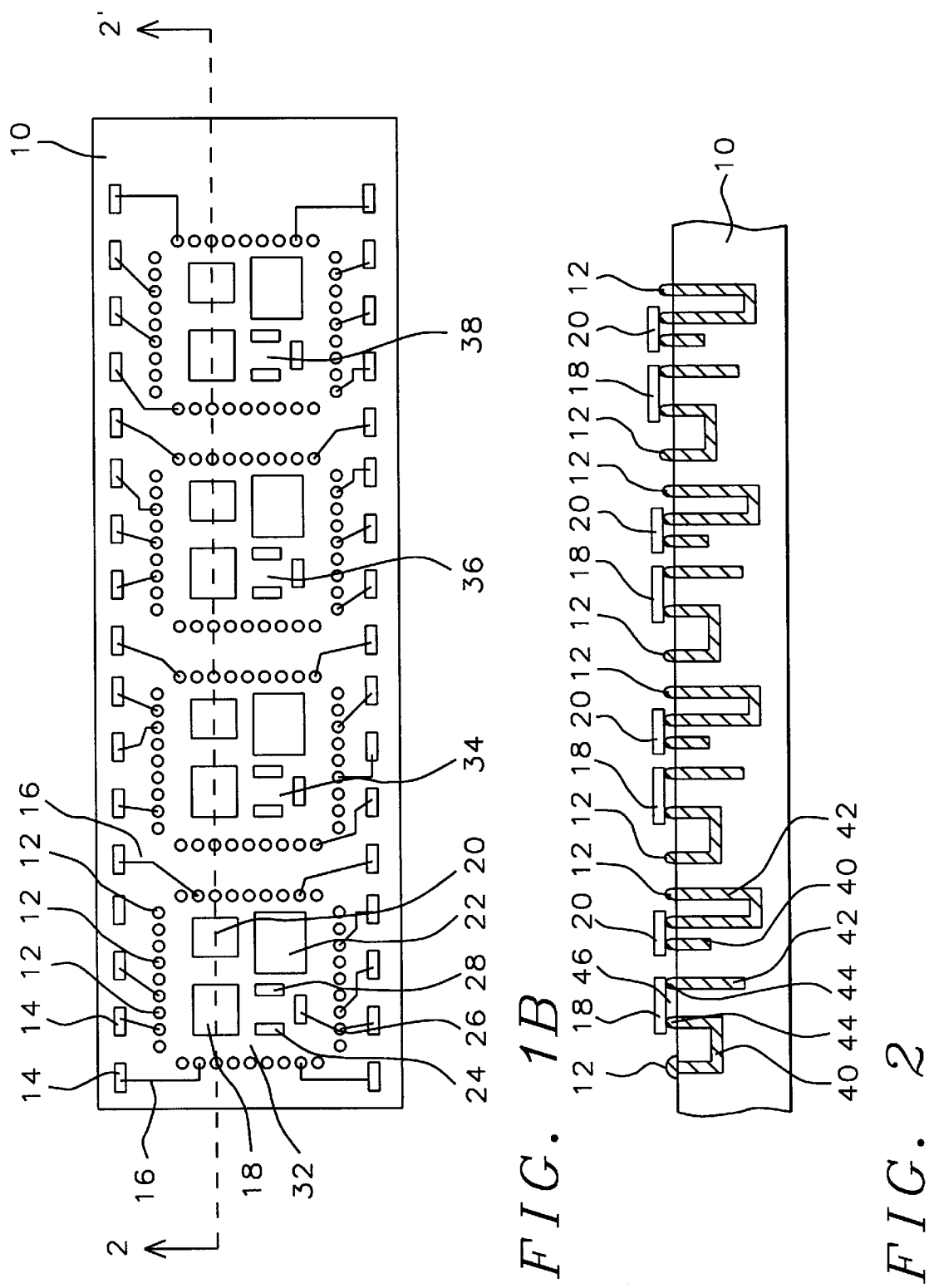

VERY THIN MULTI-CHIP-PACKAGE AND METHOD OF MASS PRODUCING THE SAME

BACKGROUND OF THE INVENTION (1) Field of the Invention

This invention relates to a multi-chip-package for active and/or passive devices. The devices are joined to a flexible tape which is then joined to a substrate having a cavity such that the devices are within the cavity.

(2) Description of the Related Art

Ultra Large Scale Integration, ULSI, packaging is discussed in a book by C. Y. Chang and S. M. Sze entitled "ULSI Technology", 1996, The McGraw-Hill Companies, Inc., pages 573–582.

U.S. Pat. No. 5,150,274 to Okada et al. describes a multi-channel module with a plurality of chips mounded on a multilayer circuit board.

U.S. Pat. No. 5,620,928 to Lee et al. shows an ultra thin ball grid array using a flex tape or printed wiring board.

U.S. Pat. No. 5,648,679 to Chillara et al. describes a dielectric flex tape substrate defining a predetermined array of electrically conductive traces and an array of solder balls or solder columns electrically connected to the bottom surface of the flex tape substrate and the traces. An integrated circuit chip having a series of input/output pads is supported on the substrate.

U.S. Pat. No. 5,602,419 to Takeda et al. describes a chip carrier semiconductor device comprising a semiconductor chip having a surface on which a plurality of contact pads, a tape carrier overlying the semiconductor chip and a plurality of leads provided on the tape carrier overlying the semiconductor chip.

U.S. Pat. No. 5,239,448 to Perkins et al. describes the formation of multichip modules. The invention shows a multichip module carrier that is constructed on a flex carrier, along with other components to form a subsystem.

U.S. Pat. No. 5,147,210 to Patterson et al. describes a first pattern of electrical conductors on a first electrical component and a second pattern of electrical conductors on a second electrical component.

A paper by A. Aintila et al. entitled "Electroless Ni/Au Bumps for Flipchip-on-Flex and TAB Applications", 1994 IEEE/CMPT Int'l Electronics Manufacturing Technology Symposium, pages 160–164 describes an electroless Ni/Au wafer bumping process.

A paper by R. W. Johnson et al. entitled "Adhesive Based, Flip Chip Technology for Assembly on Polyimide Flex Substrates", 1997 International Conference on Multichip Modules, pages 81–86 describes research conducted to develop and evaluate isotropically conductive adhesive preforms.

A paper by P. Elenius entitled "Flex on Cap-Solder Paste Bumping", 1997 International Symposium on Advanced Packaging Materials, pages 115–116 describes the capabilities and reliability results of the Flex on Cap solder bumping process.

A paper by R. Aschenbrenner et al. entitled "Flip Chip Attachment Using Anisotropic Conductive Adhesives and Electroless Nickel Bumps", 1996 IEEE/CMPT Int'l Electronics Manufacturing Technology Symposium, pages 26–33 describes studies carried out on electrical and mechanical performance of two types of anisotropic adhesives.

A paper by A. F. J. Baggerman et al. entitled "Reliable Au—Sn Flip Chip Bonding on Flexible Prints", 0569-5503/94/0000-0900 1994 IEEE, 1994 pages 900–905 describes Au—Sn flip chip bonding of integrated circuit chips on flexible polyimide prints.

A paper by C. S. Milkovich et al. entitled "Double Sided Flexible Carrier with Discretes and Thermally Enhanced FCA/COF", 0569-5503/93/0000-0016 1993 IEEE, 1993, pages 16–21 describes an electronic assembly using SMT components, wire bonded chips as well as area array chips attached to a flexible carrier.

SUMMARY OF THE INVENTION

Current Multi-Chip-Package designs call for a number of types of manufacturing technology such as silicon technology, ceramic technology, lamination technology, bonding technology and the like. The integrated circuit chips or other devices are attached using technologies such as Wire-Bonding, Flip-Chip technology or the like. With chip thicknesses of about 0.025 inches, substrate material thicknesses of about 0.050 inches, input/output pin heights of about 0.15 inches, and over-mold height required for module encapsulation of about 0.025 inches a typical multichip-package height or thickness is about 0.25 inches.

Multi-chip-packages are used in a number of applications where the package thickness is an important constraint such as wireless hand held telephones, electronic notebooks, lap top computers, pagers, PCMIA cards, and the like. These applications require packages with a very low profile.

It is a principle objective of this invention to provide a low cost method of forming a multi-chip-package having a very low profile where the elements of the package are testable before final assembly.

It is another principle objective of this invention to provide a low cost multi-chip-package having a very low profile.

These objectives are achieved by using a flexible tape and a substrate having a number of cavities formed at the chip locations. The flexible tape has a number of device blocks, a number of interconnect pads surrounding each device blocks, and a number of test pads. Integrated circuit chips or other devices are joined to the flexible tape in the device blocks. The interconnect pads and the test pads are connected to the integrated circuit chips or other devices by electrodes on or within the flexible tape. The test pads can be used to test the flexible tape with integrated circuit chips and other devices attached before joining the flexible tape to the substrate.

The substrate has a number of cavities, with a cavity to match each device block on the flexible tape, and a number of peripheral pads surrounding each cavity. The flexible tape is then joined to the substrate by joining the interconnect pads on the flexible tape to the peripheral pads on the substrate so that the integrated circuit chips and other devices joined to the flexible tape fit into the cavity of the substrate. The peripheral pads on the substrate are connected to plated through holes through the substrate and connected to input/output pads on the back of the substrate.

BRIEF DESCRIPTION OF THE DRAWINGS

FIG. 1B shows a top view of the flexible tape showing four device blocks, devices joined to the device pads in the four device blocks, and a number of test pads.

FIG. 2 shows a cross section view of the flexible tape with devices joined tot he device pads shown in FIG. 1B taken along line 2–2' of FIG. 1B.

DESCRIPTION OF THE PREFERRED EMBODIMENTS

Figure 1A:
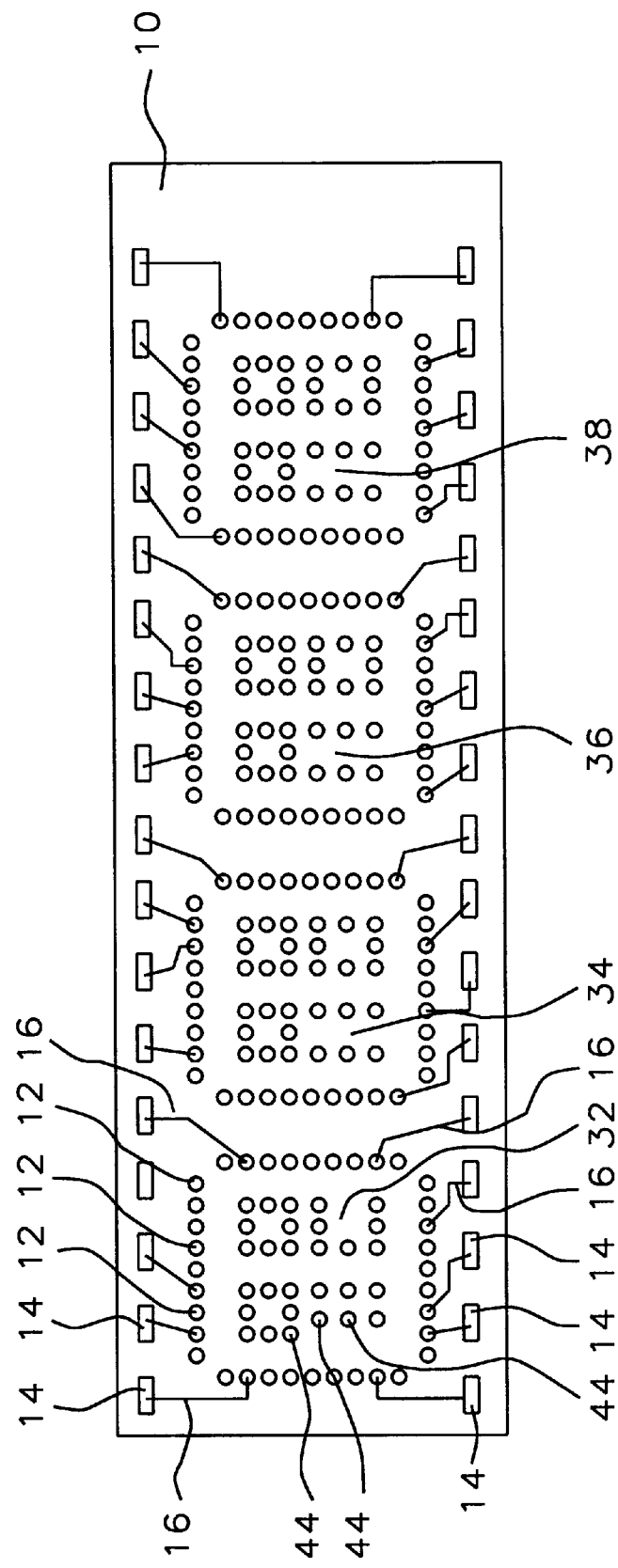
FIG. 1A shows a top view of the flexible tape showing four device blocks and a number of test pads.

Refer now to FIGS. 1–8 for a description of the preferred embodiments of the multi-chip-package of this invention. FIG. 1A shows a top view of a flexible tape assembly comprising a flexible tape 10 having four device blocks 32, 34, 36, and 38. In this example the four device blocks 32, 34, 36, and 38 are the same and only the first device block 32 will be described in detail. While this example describes four device blocks those skilled in the art will readily recognize that the number of device blocks could be larger or smaller. Each of the device blocks 32, 34, 36, and 38 have a number of device pads 44 and are surrounded by a number of interconnect pads 12. A number of test pads 14 are located along the edges of the flexible tape. A number of first electrodes 16 connect selected test pads 14 to selected interconnect pads 12.

FIG. 1B shows three integrated circuit chips 18, 20, and 22 and three passive devices 24, 26, and 28 joined to the device pads in each of the device blocks. The flexible tape in this example is formed of polyimide and has a thickness of between about 0.008 and 0.012 inches. FIG. 1B shows a number of integrated circuit chips 18, 20, and 22 and a number of passive devices 24, 26, and 28 joined to the device pads 44.

FIG. 2 is a cross section view of the flexible tape with the integrated circuit chips 18, 20, and 22 and the passive devices 24, 26, and 28 joined to the device pads of the flexible tape shown in FIG. 1B taken along line 2–2' of FIG. 1B. FIG. 2 shows that the integrated circuit devices 18 and 20 are joined to device pads 44 formed on the flexible tape. Two levels of wiring imbedded in the flexible tape form second electrodes 40 and 42 which are used to join the device pads 44 to the interconnect pads 12. The second electrodes 40 and 42 can also be used to make circuit interconnections within the flexible tape.

Figure 3A:
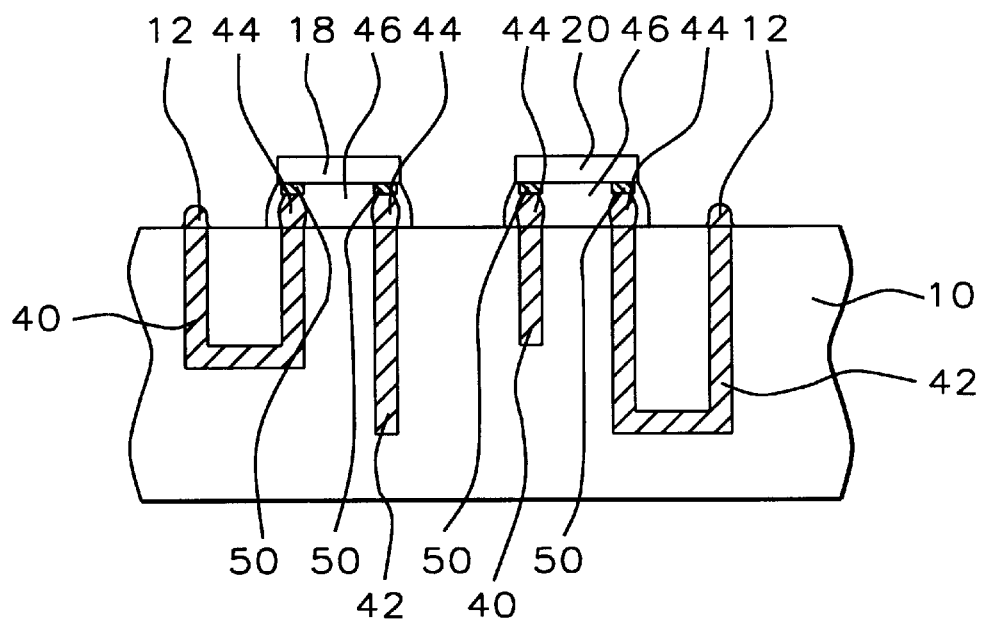
FIG. 3A shows a cross section view of a portion of one of the device blocks of the flexible tape showing integrated circuit chips joined to the flexible tape and internal electrodes within the flexible tape.
Figure 3B:
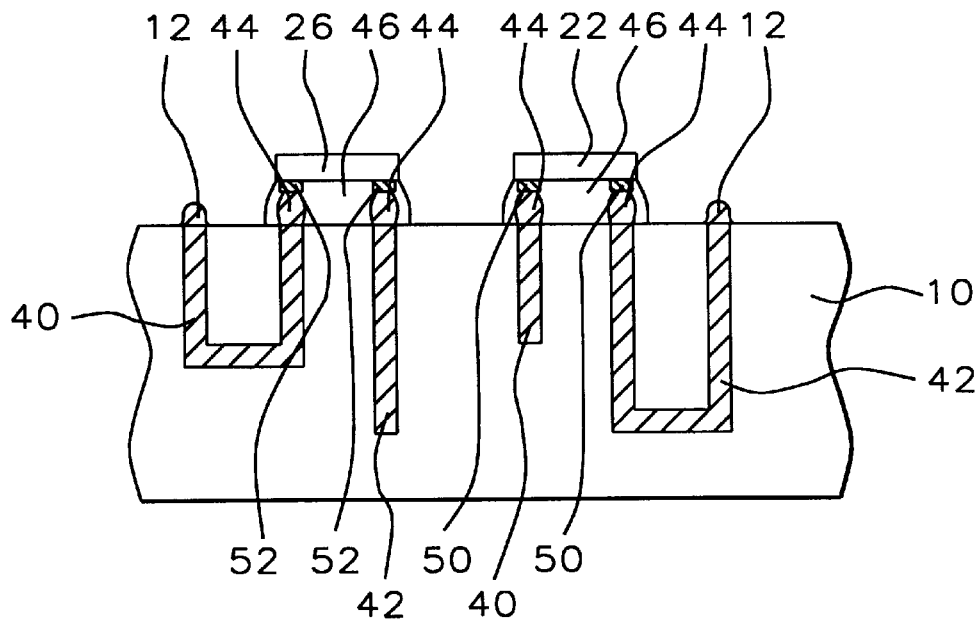
FIG. 3B shows a cross section view of a portion of one of the device blocks of the flexible tape showing passive devices joined to the flexible tape and internal electrodes within the flexible tape.

FIG. 3A shows a more detailed view of the connections between the integrated circuit chips 18 and 20 and the device pads 44. FIG. 3B shows a more detailed view of the connections between one of the passive devices 26 and the device pads 44 and one of the integrated circuit chips 26 and the device pads 44. As can be seen in FIGS. 3A and 3B the integrated circuit input/output pads 50 and the passive device input/output pads 52 are bonded to the device pads 44. The device pads on the flexible tape can be a metal such as solder, aluminum, copper, gold or the like. The integrated circuit chips and passive devices can be joined to the flexible tape using soldering, ultrasonic bonding, thermocompression bonding or the like. As is also shown in FIGS. 3A and 3B an optional under chip material 46, such as conductive epoxy or silicon based gel, can be formed underneath the integrated circuit chips 18, 20, and 22 and underneath the passive devices 24, 26, and 28. After the integrated circuit chips and passive devices have been joined to the flexible tape thereby forming a flexible tape assembly the flexible tape assembly can be electrically tested using the test pads 14.

The example shows a flexible tape with four device blocks. As those skilled in the art will readily recognize the flexible tape can have a greater or smaller number of device blocks. The flexible tape can be formed and stored, such as on a reel, and cut to the desired size as used.

Figure 4:
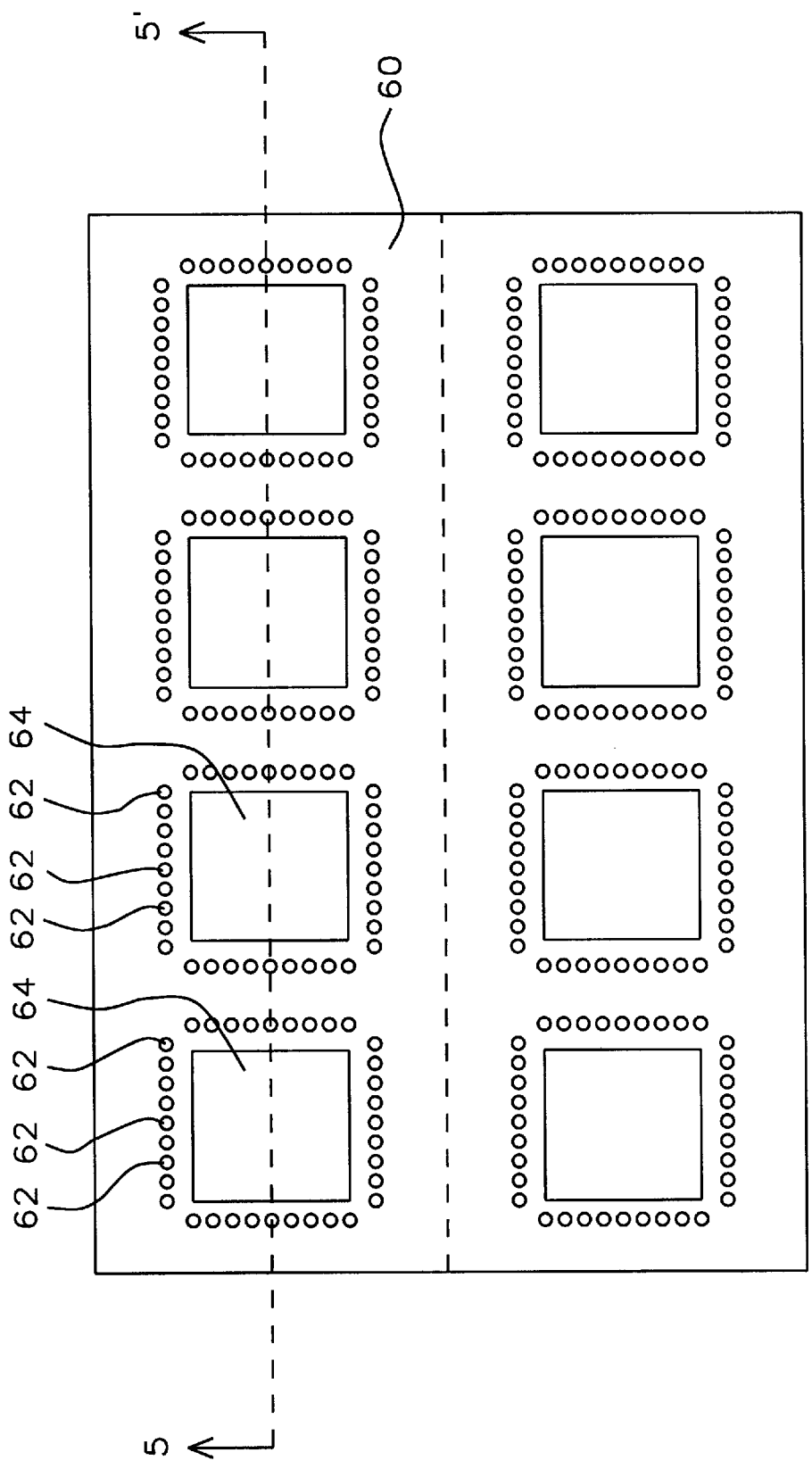
FIG. 4 shows a top view of a substrate showing eight cavities and peripheral pads surrounding each cavity.
Figure 5:
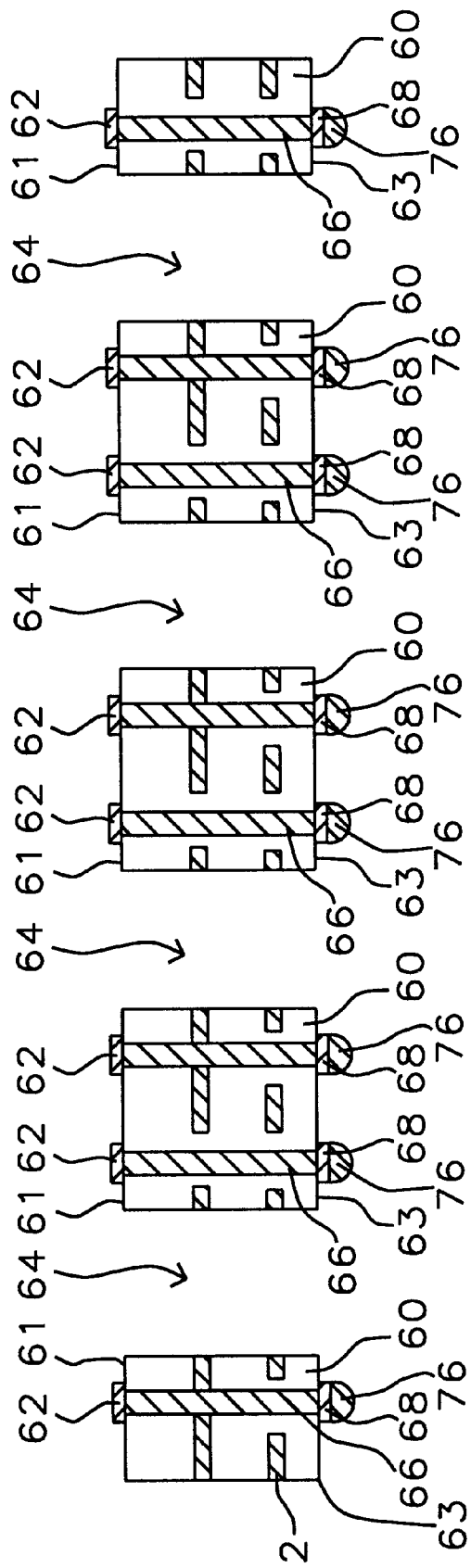
FIG. 5 shows a cross section view of the substrate shown in FIG. 4 along line 5–5' of FIG. 4.

FIG. 4 shows a top view of the substrate 60 of this invention, having a number of cavities 64 wherein each cavity is surrounded by a number of peripheral pads 62. In this example there are two rows of four cavities in each row for a total of eight cavities. Those skilled in the art will readily recognize that there could be a single row of cavities or more than two rows of cavities having more than four cavities per row or fewer than four cavities per row. FIG. 5 shows a cross section view of the substrate along the line 5–5' of FIG. 4. As can be seen in FIG. 5 the cavities 64 extend from the top surface 61 through the bottom surface 63 of the substrate 60. As can also be seen in FIG. 5 the peripheral pads 62, which are on the top surface 61 of the substrate 60, are connected to plated through holes 66 which extend through the entire thickness of the substrate 60 through the bottom surface 63 of the substrate. Input/output pads 68 are formed on the bottom surface of the substrate 60. Optionally, solder pads 76 can be formed on the input/output pads 68. The substrate is formed of a number layers bonded together permitting the formation of a number of power and/or ground planes between the top surface 61 and the bottom surface 63 of the substrate. This example shows one ground plane 70 and one power plane 72.

The substrate is formed having an array of rows and columns of cavities, in this example a two by four array, and then cut to the desired size. The substrate has a thickness of between about 0.04 and 0.06 inches. The peripheral pads 62 and the input/out pads can be formed of metals such as aluminum, copper, gold, solder, or the like.

Figure 6:
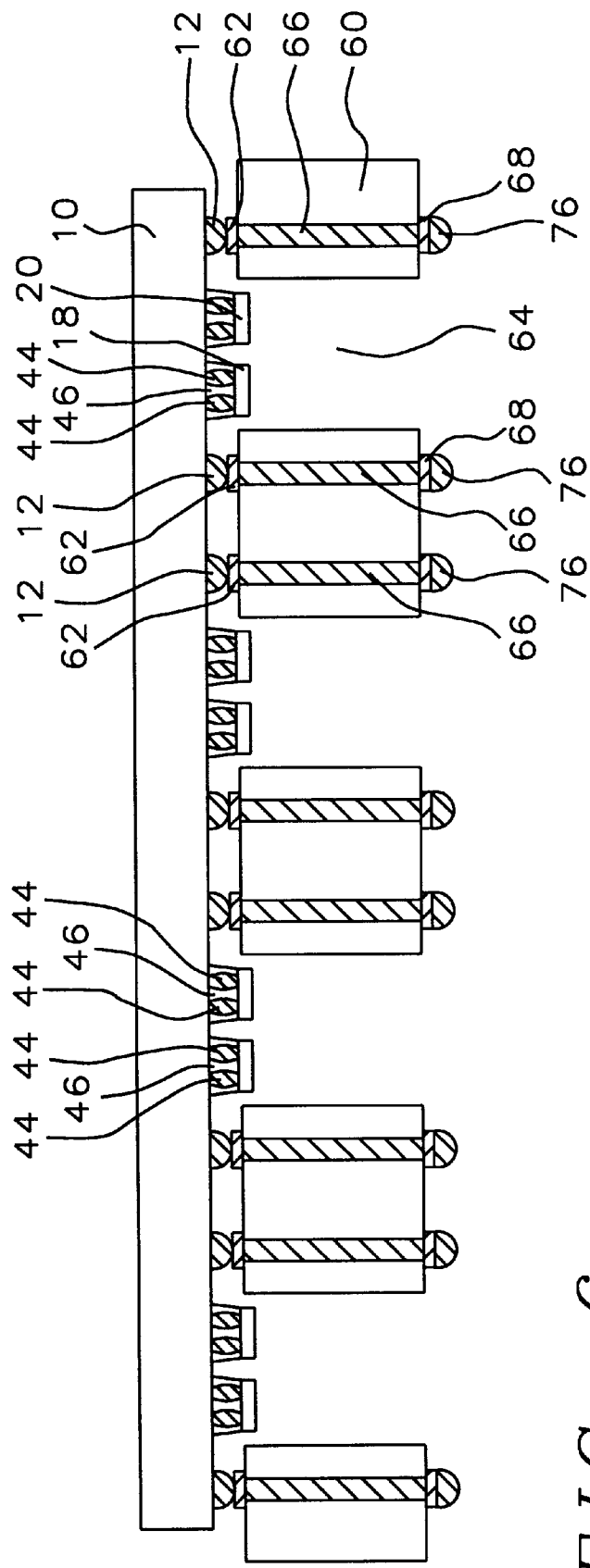
FIG. 6 shows a cross section view of a flexible tape with devices attached joined to a substrate.

As shown in FIG. 6 the tape assembly with the integrated circuit chips and passive devices bonded in place is brought together with the substrate such that the device blocks on the tape assembly match the cavities in the substrate, the integrated circuit devices and passive devices extend into the cavity, and the interconnect pads 12 on the tape assembly match the peripheral pads 62 on the substrate. The interconnect pads 12 on the tape assembly are then bonded to the peripheral pads 62 on the substrate, using means such as soldering, ultrasonic bonding, thermocompression bonding, or the like thereby forming a substrate assembly. The thickness of the entire substrate assembly formed in this manner is between about 0.050 and 0.074 inches.

Figure 7:
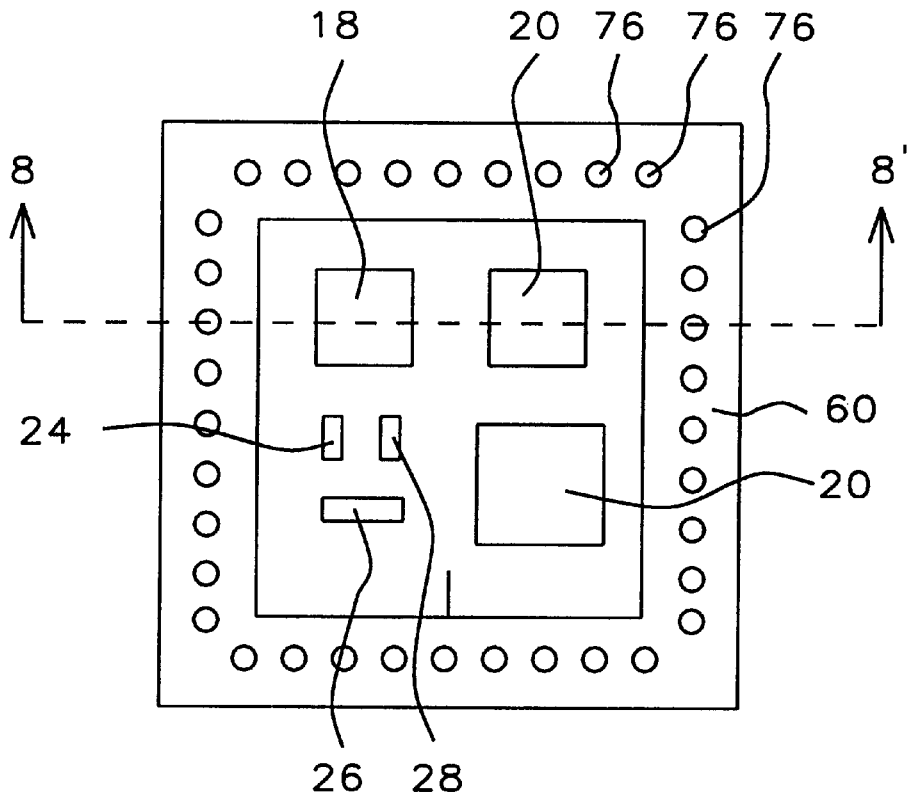
FIG. 7 shows a bottom view of a flexible tape with a single device block and devices attached joined to a substrate having a single cavity.
Figure 8:
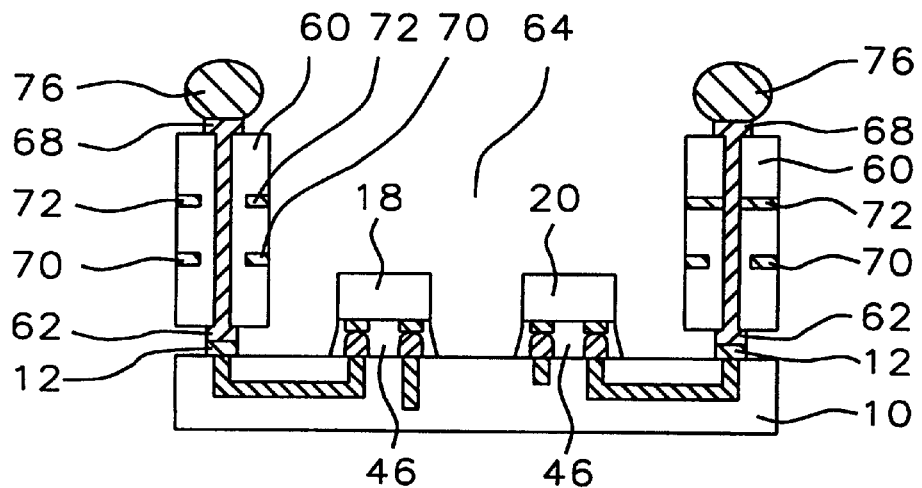
FIG. 8 shows a cross section view of the flexible tape and substrate assembly taken along line 8–8' of FIG. 7.

The flexible tape and the substrate can be formed or cut to accommodate any number of device blocks desired. FIGS. 7 and 8 show a substrate assembly having a single device block and a single cavity. FIG. 7 shows a bottom view of the substrate assembly and FIG. 8 shows a cross section view of the substrate assembly taken along line 8–8' of FIG. 7.

The flexible tapes and substrates of this invention provide a great deal of manufacturing flexibility. The substrates can be manufactured in large arrays and cut to the desired size. The flexible tape can be stored on a reel for easy manufacturability during the joining of the integrated circuit chips or passive devices. Since the devices are within the substrate cavity in the completed substrate assembly the substrate assembly has a very thin form factor, having a thickness of between about 0.050 and 0.074 inches.

While the invention has been particularly shown and described with reference to the preferred embodiments thereof, it will be understood by those skilled in the art that various changes in form and details may be made without departing from the spirit and scope of the invention.

What is claimed is:

1. A method of forming a multi-chip package, comprising the steps of:

providing a flexible tape having a first number of device blocks, a second number of interconnect pads surrounding each of said device blocks, a third number of device pads in each of said device blocks, a fourth number of test pads, first electrodes connecting said test pads to said interconnect pads, and second electrodes connecting said interconnect pads to said device pads;

providing a fifth number of devices;

providing a substrate having a first surface, a second surface, a sixth number of cavities, said second number of peripheral pads on said first surface of said substrate, said second number of input/output pads on said second surface of said substrate, and said second number of plated through holes wherein each of said plated through holes is connected to one of said peripheral pads and one of said input/output pads and extends from said first surface to said second surface;

attaching said fifth number of devices to said device pads in said device blocks of said flexible tape thereby forming a flexible tape assembly; and attaching said flexible tape assembly to said substrate by connecting said interconnect pads on said flexible tape to said peripheral pads on said substrate so that said devices attached to said device pads are within said cavities of said substrate thereby forming a substrate assembly.

2. The method of claim 1 wherein said flexible tape is made up of a first layer, a second layer, and a third layer bonded together wherein said interconnect pads, said device pads, said test pads, and said first electrodes are formed on said first layer and said second electrodes are formed between said first layer and said second layer and between said second layer and said third layer.

3. The method of claim 1 wherein said substrate has a ground plane and a power plane imbedded between said first surface of said substrate and said second surface of said substrate.

4. The method of claim 1 wherein said interconnect pads are solder.

5. The method of claim 1 wherein said fifth number of devices comprises integrated circuit chips, passive device chips, or a combination of integrated circuit chips and passive device chips.

6. The method of claim 1 wherein said flexible tape assembly is electrically tested using said test pads before attaching said flexible tape assembly to said substrate.

7. The method of claim 1 wherein said attaching said devices to said device pads in said device blocks of said flexible tape uses soldering.

8. The method of claim 1 wherein said attaching said devices to said device pads in said device blocks of said flexible tape uses thermocompression bonding.

9. The method of claim 1 wherein said flexible tape has a thickness of between about 0.008 and 0.012 inches.

10. The method of claim 1 wherein said substrate has a thickness of between about 0.04 and 0.06 inches.

11. The method of claim 1 wherein said substrate assembly has a thickness of between about 0.050 and 0.074 inches.

12. The method of claim 1 wherein said substrate has a thickness of between about 0.04 and 0.06 inches.

13. The method of claim 1 wherein said substrate assembly has a thickness of between about 0.050 and 0.074 inches.

* * * * *